United States Patent
Stevens et al.

(10) Patent No.: US 6,306,676 B1
(45) Date of Patent: *Oct. 23, 2001

(54) METHOD OF MAKING SELF-ALIGNED, HIGH-ENEGRY IMPLANTED PHOTODIODE FOR SOLID-STATE IMAGE SENSORS

(75) Inventors: Eric G. Stevens; Stephen L. Kosman, both of Rochester; David L. Losee, Fairport; James P. Lavine, Rochester, all of NY (US)

(73) Assignee: Eastman Kodak Company, Rochester, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/628,063

(22) Filed: Apr. 4, 1996

(51) Int. Cl.[7] ................................................ H01L 21/00

(52) U.S. Cl. ................................ 438/48; 438/75; 438/144

(58) Field of Search .............................. 438/75, 76, 78, 438/79, 144, FOR 213, 48; 257/233

(56) References Cited

U.S. PATENT DOCUMENTS

| | | | |
|---|---|---|---|
| 4,009,058 | * 2/1977 | Mills | 438/560 |
| 4,128,843 | 12/1978 | Chiang | 257/222 |
| 4,732,866 | * 3/1988 | Chruma et al. | 438/530 |
| 4,898,834 | 2/1990 | Lockwood et al. | 438/796 |
| 5,070,380 | 12/1991 | Erhardt et al. | 257/76 |
| 5,181,093 | * 1/1993 | Kawaura | 257/233 |
| 5,223,726 | 6/1993 | Yamada et al. | 257/244 |
| 5,233,209 | 8/1993 | Rodgers et al. | 257/171 |
| 5,235,198 | 8/1993 | Stevens et al. | 257/232 |

(List continued on next page.)

FOREIGN PATENT DOCUMENTS

| | | | |
|---|---|---|---|
| 62-16564 | 1/1987 | (JP) . | |
| 5-315591 | 11/1993 | (JP) . | |
| 6-53475 | * 2/1994 | (JP) | 438/FOR 213 |
| 6-85233 | * 3/1994 | (JP) | 438/FOR 213 |
| 6-112464 | * 4/1994 | (JP) | 438/FOR 213 |
| 7-30091 | * 1/1995 | (JP) | 438/FOR 213 |

OTHER PUBLICATIONS

N. Teranishi, et al., "No Image Lag Photodiodes Structure in the Interline CCD Image Sensor", IEDM Tech. Dig., pp. 324–327, Dec. 1982.

B. C. Burkey, et al, "The Pinned Photodiode for an Interline–Transfer CCD Image Sensor", IEDM Tech. Dig., pp. 28–31, Dec. 1984.

J. O. Borland and R. Koelsch, "MeV Implantation Technology: Next Generation–Manufacturing With Current–Generation Equipment", Solid–State Technology, pp. 1 through 8, Dec. 1993.

*Primary Examiner*—Michael Trinh
(74) *Attorney, Agent, or Firm*—Peyton C. Watkins

(57) ABSTRACT

A method and apparatus of making high energy implanted photodiode that is self aligned with the transfer gate, the high energy implant is defined by providing a substrate, or well, of a first conductivity type, defining a charge coupled device within the substrate, or well, such that gate electrode layers are allowed to exist over areas to contain photodiodes during construction of the charge coupled device, patterning a masking layer to block high energy implants such that openings in the masking layer are formed over the areas of the photodiodes, anisotropically etching down through the gate electrode over the photodiodes to the gate dielectric material, implanting photodiodes with high-energy ions of a second conductivity type opposite the first conductivity type and creating a pinned photodiode by employing a shallow implant of the first conductivity type. The apparatus made by this method yields a photodiode employing high energy ions to form the P/N junction that is self aligned with the transfer gate.

20 Claims, 1 Drawing Sheet

U.S. PATENT DOCUMENTS

| | | | | |
|---|---|---|---|---|
| 5,238,864 | * | 8/1993 | Maegawa et al. | 438/75 |
| 5,313,080 | | 5/1994 | Jung | 257/223 |
| 5,341,028 | | 8/1994 | Yamaguchi et al. | 257/344 |
| 5,385,849 | * | 1/1995 | Nakashiba | 438/75 |
| 5,385,860 | * | 1/1995 | Watanabe | 438/144 |
| 5,460,997 | * | 10/1995 | Hawkins et al. | 438/144 |
| 5,476,808 | * | 12/1995 | Kusaka et al. | 438/75 |
| 5,567,632 | * | 10/1996 | Nakashiba et al. | 438/78 |
| 5,576,239 | * | 11/1996 | Hatano et al. | 438/75 |
| 5,596,186 | * | 1/1997 | Kobayashi | 257/186 |
| 5,723,354 | * | 3/1998 | Park et al. | 38/75 |

\* cited by examiner

METHOD OF MAKING SELF-ALIGNED, HIGH-ENEGRY IMPLANTED PHOTODIODE FOR SOLID-STATE IMAGE SENSORS

FIELD OF INVENTION

The invention relates generally to the field of image sensors, and in particular to image sensors with pinned photodiodes. More specifically, the invention relates to high energy implants used to create pinned photodiodes.

BACKGROUND OF THE INVENTION

The use of photodiodes as photodetector elements in interline CCD image sensors is well known and has been discussed in various prior art documents. The problem of image lag and how a pinned-photodiode structure, in principle, can eliminate this lag has been discussed by N. Teranishi et al., in "No Image Lag Photodiodes Structure in the Interline CCD Image Sensor", in IEDM Tech. Dig., pages 324–327, December 1982. However, in practice there are various manufacturing and processing difficulties that lead to the creation of residual potential wells and barriers at the transfer gate edge that can actually preclude making these photodiodes lag free as discussed by B. C. Burkey et al., in "The Pinned Photodiode For An Interline-Transfer CCD Image Sensor", in IEDM Tech. Dig., pages 28–31, December, 1984. These difficulties arise from a general lack of self alignment of the photodiode implants to the transfer gate edge.

High-energy photodiode implants, using an n-type cathode layer, are used to simplify the process by eliminating long (in time), high-temperature drives as discussed by J. O. Borland and R. Koelsch, in "MeV Implantation Technology: Next Generation-Manufacturing With Current-Generation Equipment", Solid-State Technology, December 1993, and to improve sensitivity by creation of a larger collection volume. Although the associated larger ion range of these higher implant energies lead to better photodiodes, they present difficulties in terms of self alignment of the photodiode to the transfer gate edge, and in the elimination of residual potential wells and barriers required for lag-free operation.

It should be apparent from the foregoing discussion that there remains a need within the art for a product and a process for making self-aligned photodiodes using high-energy implants that results in improved performance and simplified manufacturing.

SUMMARY OF THE INVENTION

Therefore, it is the object of this invention to overcome the above mentioned difficulties. It is a further object of this invention to provide a product and process for making a self aligned, high energy implanted photodiode defined by the steps of: providing an imaging area on a semiconductor substrate having at least one gate dielectric layer on a major surface with at least one gate electrode layer on top of the dielectric layer on the major surface; providing a CCD formed within the imaging area having a plurality of cells arranged such that each cell within the CCD is adjacent to at least one photodetector area and each photodetector is coupled to the CCD through a transfer gate, the photodetector area being defined such that the gate electrode layer and the gate dielectric layer are allowed to exist over photodetector areas during formation of the CCDs, then patterning a masking layer to block high energy implants such that openings in the masking layer are formed over the photodetector areas; anisotropically etching down through the gate electrode layer over the photodetector areas while leaving the gate dielectric layer essentially intact; and creating a photodiode within the photodetector areas via a high energy implant such that the photodiode is self aligned with at least one edge of the transfer gate.

The basic components of a typical interline CCD image sensor pixel are a photodiode used for signal detection and collection, a CCD used for charge transport of the signal charge to the output of the device, a transfer gate used to transfer the photocharge collected in the photodiode to the CCD, and channel stops used to isolate and contain charge within the various regions of the pixel. Both linear and area-arrays can be made of the interline type.

Typically, layers of polysilicon are used to form the gate electrodes of the CCD and the photodiode-to-CCD transfer gate. In a typical CCD process, these polysilicon layers are removed from over the photodiode during the formation of the CCDs and transfer gates. The photodiodes are then formed using the polysilicon transfer gates as masking layers to self align the photodiode implants to the edges of the transfer gates. However, if the energies used to implant the photodiodes are very high, the range of the ions may be greater than the thickness of the polysilicon layer. Hence, they may go into the underlying substrate thereby causing undesirable, lag-inducing wells and/or barriers at the input edge of the transfer gate, i.e., the implants are no longer self aligned to the transfer gate.

The present invention leaves layers used in creating the CCD gate electrodes (e.g., polysilicon) over the photodiodes (either entirely or partially) during formation of the CCDs, and then later in the fabrication process to come back and define the photodiode by the steps of: depositing a first masking layer (such as photoresist) over the device surface thick enough to block the high-energy photodiode implants, defining this masking layer so that openings are formed over where the photodiode will be implanted, anisotropically etching down through the CCD gate electrode material remaining over the photodiode and stopping on gate electrode dielectric material (e.g., $SiO_2$), and then implanting the photodiode with high-energy ions in a self-aligned manner to the edge of the first masking layer and transfer gate edge.

The above and other objects of the present invention will become more apparent when taken in conjunction with the following description and drawings wherein identical reference numerals have been used, where possible, to designate identical elements that are common to the figures.

ADVANTAGEOUS EFFECT OF THE INVENTION

The primary advantage of this process is that it provides a method of ion implanting a photodiode self-aligned to its transfer gate using high implant energies to make an interlaced, or non interlaced, interline photodiode imager with all the associated performance improvements and manufacturing simplifications. The self aligned feature of the process provides improved manufacturability and reduced image lag. The use of high-energy implantation for the photodiodes reduces processing time and improves the sensitivity of the sensor. Also, the present invention does not require any additional masking steps in a conventional CCD process.

DETAILED DESCRIPTION OF THE INVENTION

We have discovered a method and apparatus for making self aligned photodiodes using high energy implants to alleviate the previously discussed problems within the prior art. The preferred embodiment of the present invention employs an N-type, high energy implant into either a P-well within an N-type substrate, or directly into a P-type substrate. However, the present invention could also be constructed by reversing the conductivity types, as would be apparent to those skilled in the art.

Figure 1:
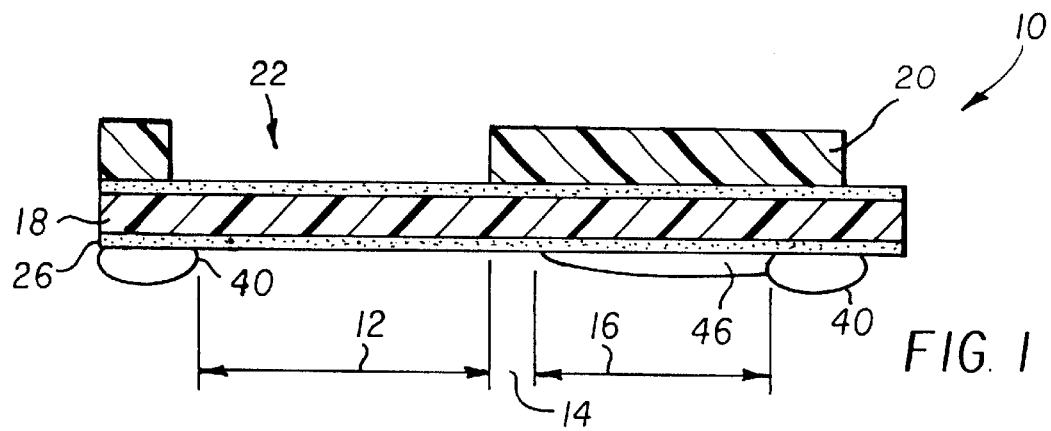
FIG. 1 shows a cross section of an interline image sensing device through the photodiode, transfer gate, and CCD.

Referring now to FIG. 1, which shows a cross section of an interline image sensing device 10 taken through the photodiode area 12, transfer gate 14, and charge coupled device (CCD) 16 as indicated, to illustrate the basic concept of the present invention of leaving layers used to create the CCD gate electrodes (e.g., polysilicon) over the photodiode area (either entirely or partially) during formation of the CCDs, and then later in the fabrication process to come back and define the photodiode. As seen in FIG. 1, the CCD 16 is defined such that the polysilicon 18 used for the gate electrode has been left covering the photodetector area and a first masking layer of thick photoresist 20 has been deposited and patterned to leave opening 22 through which the photodiodes will subsequently be implanted within the photodiode area 12. This particular cross section is shown for a device having two levels of polysilicon as the CCD gate electrode material with insulating layers of SiO$_2$ between, and underneath them. The first level of polysilicon 18 is shown in an embodiment wherein it covers the entire photodiode. It should be understood, however, that this could be the second layer of polysilicon as well. The polysilicon level over the photodiode, within the preferred embodiment, will be the same as that used for the transfer gate.

Figure 2:
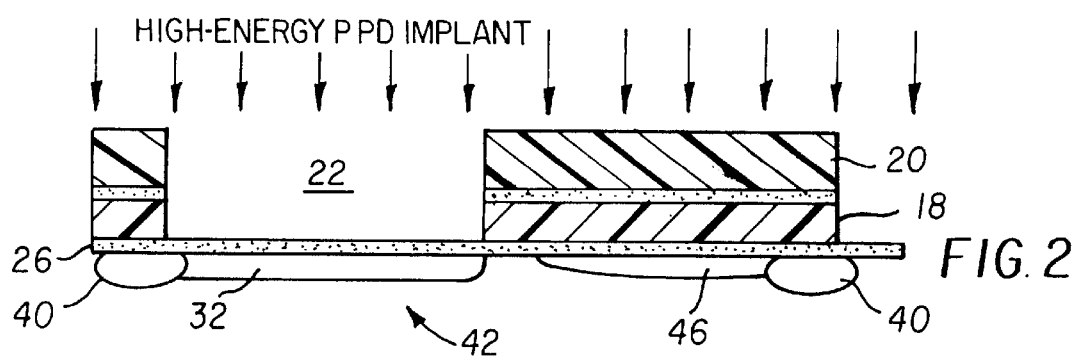
FIG. 2 shows the device in FIG. 1 after anisotropically etching down through the CCD's gate electrodes to the SiO$_2$ gate dielectric layer.

Referring now to FIG. 2, which shows the same area of the device as in FIG. 1 in a cross section after an anisotropic etch down through the CCD's gate electrodes to the SiO$_2$ gate dielectric layer has been performed within the photodiode area 12, the self aligning techniques of the present invention will become readily apparent. An anisotropic etch is performed in the areas left open by photoresist layer 20. At this point in the process a high-energy, N-type cathode 32 of the photodiode 42 is implanted through the opening 22 in photoresist 20. Preferably phosphorus is used as the high energy ion in order to provide deeper penetration into the silicon. As can be seen from this figure, this high energy N-type implant 32 will be self aligned to the edge of the transfer gate 14 by way of the thick photoresist masking layer 20. Also note that the channel stop 40 on the left-hand side of the photodiode 42 extends into the cathode 32 of the photodiode 42 region. This channel stop 40 is a conductivity opposite from that used in the high energy implant to create N-type cathode 32 and is to provide electrical continuity between the channel stop and the subsequent pinning implant at the surface of the photodiode.

Still referring to FIG. 2, the self aligned high energy implanted photodiode 42 is defined by providing an imaging area on a P-type substrate or a P-type well in an N-type substrate, such that the imaging area has at least one gate dielectric layer 26 on a major surface with at least one gate electrode layer on top of the dielectric layer on the major surface. The present invention envisions providing CCD 16 formed within the imaging area having a plurality of cells arranged such that each cell within the CCD is adjacent to at least one photodetector area and each photodetector is coupled to the CCD through a transfer gate. The present invention is, therefore, applicable to interlaced devices in which there will be two photodetectors coupled to a CCD cell 46, or progressive scan devices wherein typically only a single photodetector is coupled to one CCD cell. It should be understood that in either of these embodiments the photodetector area is being defined such that the gate electrode layer and the gate dielectric layer are allowed to exist, either entirely or in part, over photodetector areas while the CCD 16 is created. After the CCD 16 is created, a masking layer 20 is used to block high energy implants by patterning masking layer 20 such that openings 22 in the masking layer 20 are formed over the photodetector areas 12. The thick photoresist masking layer 20 allows anisotropically etching down through the gate electrode layer over the photodetector areas 12 while leaving the gate dielectric layer 26 essentially intact so that the photoresist and transfer gate edges are aligned with one another, (i.e. coplanar). By creating a photodiode 42 within the photodetector areas 12 via a high energy implant 32 such that the photodiode 42 is self aligned with at least one edge of the transfer gate 14, the present invention effectively overcomes the problems discussed within the prior art.

Figure 3:
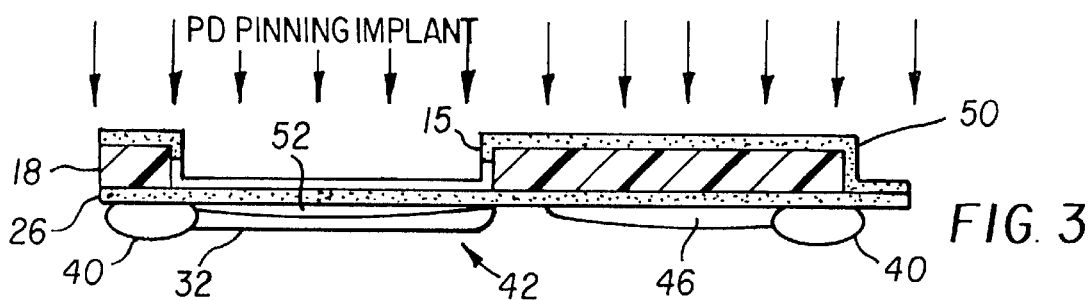
FIG. 3 shows the growth of a thin SiO$_2$ spacer on the edge of the transfer gate prior to forming a p-type pinning implant.

FIG. 3 shows the next step in the process which is to grow a thin SiO$_2$ spacer 50 on the edge of the transfer gate after which the so-called, p-type pinning implant 52 is performed. The P-type pinning implant 52 is typically done with a sufficiently low energy such that the ions will not penetrate the polysilicon transfer gate electrode. Preferably, boron ions are used to make P-type implant 52. The SiO$_2$ spacer 50 is used to prevent the lateral spread of this p-type implant 52 from underneath the input edge 15 of the transfer gate 14, but is not necessarily part of the invention which could be practiced without spacer 50.

Figure 4:
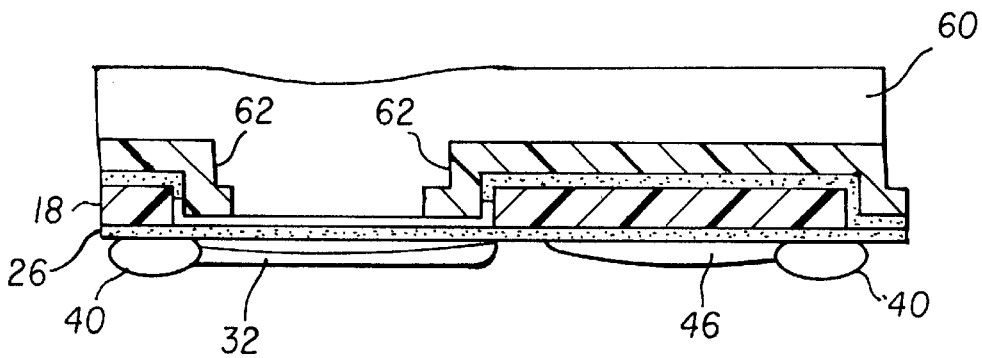
FIG. 4 shows an example of the completed device structure in cross section.

FIG. 4 shows an example of the completed device structure in a cross section illustrating the pinned photodiode 42 of FIG. 2 with the opaque light shield 62 around photodiode 42 and passivation layer 60.

It will be understood by those skilled in the art, that previous discussion pertains to self aligned diodes that are created from high energy implants of N-type ions. In order to accomplish this either a P-type substrate or a P well within an N-type substrate is employed. However, it is also possible to create self aligned photodiodes within an N-type substrate or an N well within a P-type substrate using the techniques described previously.

While the preferred embodiment has been disclosed, modifications will be readily apparent to those skilled in the art. Among these modifications are: employing three and four phase charge coupled devices, double and triple layers of polysilicon, and SiO$_2$/Si$_3$N$_4$/SiO$_2$ gate dielectrics, for example.

Additionally, it is envisioned that a buried channel photocapacitor can be made by provision of an electrode after the self-aligned implant.

The invention has been described with reference to a preferred embodiment. However, it will be appreciated that variations and modifications can be effected by a person of ordinary skill in the art without departing from the scope of the invention as defined by the appended claims.

Parts List 10 image sensing device
12 photodiode area
14 transfer gate
16 charge coupled device
18 polysilicon
20 photoresist
22 opening in photoresist
26 gate dielectric
32 N-type high energy implant
40 channel stop
42 photodiode
46 CCD cell
50 SiO$_2$ spacer
52 pinning layer
60 passivation layer
62 opaque light shield

What is claimed is:

1. A method of making a self aligned high energy implanted photodiode, the method comprising the steps of:

providing an imaging area on a semiconductor substrate of a first conductivity type, the imaging area having at least one gate dielectric layer on a major surface with at least one gate electrode layer on top of the dielectric layer on the major surface;

providing the imaging area with a plurality of photodetectors and at least one CCD formed within the imaging area, the CCD having a plurality of cells arranged such that each of the photodetectors is adjacent to one of the cells within the CCD and each photodetector is coupled to the CCD through a transfer gate on one side of the photodetector area, the photodetector having a channel stop formed of the first conductivity type on the opposite side of the photodetector;

the method further comprises the steps in the sequence set forth:

(a) providing the photodetector area having a gate electrode layer and a gate dielectric layer existing over the photodetector area;

(b) first etching the gate electrode layer during formation of the CCD;

(c) patterning a masking layer to block high energy implants such that openings in the masking layer are formed over the photodetector areas and a portion of the channel stop;

(d) second etching anisotropically down through the gate electrode layer over the photodetector areas and the portion of the channel stop while leaving the gate dielectric layer essentially intact; and (e) using a high energy implant to create a photodiode of a second conductivity type opposite the first conductivity type within the photodetector areas such that the photodiode is self aligned with at least one edge of the transfer gate and the photodiode overlaps the channel stop.

2. The method of claim 1 further comprising the step of creating a pinned photodiode by employing a shallow implant on the major surface on top of the photodiode, the low energy implant being of a conductivity type opposite the high energy implant.

3. The method of claim 1 wherein the step of patterning a masking layer to block high energy implants further comprises applying a layer of photoresist material such that openings in the photoresist layer are formed over the photodetector areas.

4. The method of claim 1 wherein the substrate is selected from one of the following: a P-type substrate; a P-type well within an N-type substrate; a substrate with epitaxial layers; a substrate without epitaxial layers; a substrate employing wells; or a substrate not employing wells.

5. The method of claim 1 wherein the high energy implant is an N-type implant.

6. The method of claim 1 wherein prior the step of creating a pinned photodiode further comprises a step of placing a spacer layer over at least the transfer gate before the step of creating a pinned photodiode is performed.

7. The method of claim 1 further comprising creating a pinned photodiode by employing a shallow implant on the major surface on top of the photodiode, the shallow implant being of a conductivity type opposite the high energy implant and electrically connected to the channel stop.

8. The method of claim 1 further comprising the step of converting the photodiode into a buried-channel photocapacitor by adding an electrode layer over the high energy implant.

9. A method of making a self aligned high energy implanted photodiode defined by the steps of:

providing a substrate of a first conductivity type with at least one well on a major surface of the substrate, the well being formed from a second conductivity type opposite the first conductivity type;

defining a charge coupled device within the well such that a gate electrode layer and a gate dielectric layer exist over areas to contain photodiodes, and first etching the gate electrode during construction of the charge coupled device, and implanting a channel stop of the first conductivity type on one side of each of the areas to contain photodiodes such that the channel stop overlaps the photodiode area;

the method further comprises the steps in the sequence set forth:

(a) patterning a masking layer to block high energy implants such that openings in the masking layer are formed over the areas of the photodiodes and at least a portion of the channel stop; second etching anisotropically down through the gate electrode layer over the photodiodes and the portion of the channel stop to the gate dielectric layer, and (c) implanting photodiodes with high-energy ions of the first conductivity type such that the photodiodes are self aligned with the input edge of the transfer gate and the photodiode overlaps the channel stop.

10. The method of claim 9 further comprising the step of creating a pinned photodiode by employing a shallow implant of the second conductivity type, on top of the high energy implant and at the major surface.

11. The method of claim 9 wherein the step of patterning a masking layer to block high energy implants further comprises applying a layer of photoresist material such that openings in the photoresist layer are formed over the areas of the photodiodes.

12. The method of claim 9 wherein the first conductivity type is n-type and the second conductivity type is p-type.

13. The method of claim 12 wherein prior the step of creating a pinned photodiode a step of placing a spacer layer over at least the transfer gate is performed.

14. A method of making an implanted photodiode defined by the steps of:

providing an imaging area on a semiconductor substrate of a first conductivity type with a plurality of photodetectors and a CCD with a plurality of cells adjacent to the photodetectors such that each of the photodetectors is adjacent one of the CCD cells;

secondly providing a transfer gate on one side of the photodetector area and a channel stop formed of the first conductivity type on the opposite side of the photodetector, the photodetector area being defined such that a gate electrode layer and a gate dielectric layer exist over photodetector areas, and first etching the gate electrode area during formation of the CCD;

the method further comprises the steps in the sequence set forth:

(a) patterning a masking layer to block high energy implants such that openings in the masking layer are formed over the photodetector areas and a portion of the channel stop;

(b) anisotropically etching down through the gate electrode layer over the photodiode area and the portion of the channel stop while leaving the gate dielectric layer substantially intact; and (c) using a high energy implant to create a photodiode of a second conductivity type opposite the first conductivity type within the photodetector areas such that the photodiode is self aligned with at least one edge of the transfer gate, overlaps the channel stop.

15. The method of claim 14 further comprising the step of creating a pinned photodiode by employing a shallow implant on the major surface on top of the photodiode, the low energy implant being of a conductivity type opposite the high energy implant.

16. The method of claim 14 wherein the substrate is selected from one of the following: a P-type substrate; a P-type well within an N-type substrate; a substrate with epitaxial layers; a substrate without epitaxial layers; a substrate employing wells; or a substrate not employing wells.

17. The method of claim 14 wherein the high energy implant is an N-type implant.

18. The method of claim 15 wherein prior to the step of creating a pinned photodiode further comprises a step of placing a spacer layer over at least the transfer gate before the step of creating pinned photodiode is performed.

19. The method of claim 14 further comprising creating a pinned photodiode by employing a shallow implant on the major surface on top of the photodiode, the shallow implant being of a conductivity type opposite the high energy implant and electrically connected to the channel stop.

20. The method of claim 14 further comprising the step of converting the photodiode into a buried-channel photocapacitor by adding an electrode layer over the high energy implant.

* * * * *